United States Patent
Twynam

[19]

[11] Patent Number: 6,111,265
[45] Date of Patent: Aug. 29, 2000

[54] GUNN DIODE HAVING A GRADED ALUMINUM GALLIUM ARSENIDE ACTIVE LAYER AND GUNN DIODE OSCILLATOR

[75] Inventor: John Kevin Twynam, Tenri, Japan

[73] Assignee: Sharp Kabushiki Kaisha, Osaka, Japan

[21] Appl. No.: 09/276,173

[22] Filed: Mar. 25, 1999

[30] Foreign Application Priority Data

Mar. 25, 1998 [JP] Japan .................................. 10-077937

[51] Int. Cl.[7] .............................. H01L 47/02; H03B 5/12
[52] U.S. Cl. .............................. 257/6; 257/191; 257/196; 331/107 G
[58] Field of Search .................. 257/6, 191, 196, 257/183; 331/107 G

[56] References Cited

U.S. PATENT DOCUMENTS 4,649,405  3/1987  Eastman ........................ 357/3
4,801,982  1/1989  Couch et al. ................... 357/3
4,914,489  4/1990  Awano .......................... 257/6

FOREIGN PATENT DOCUMENTS 58-122791A  7/1983  Japan .

OTHER PUBLICATIONS

Couch, N. R. et al. "Hot Electron Injection in Millimetre Wave Gun Diodes." Solid–State Electronics, vol. 32, No. 12, pp. 1685–1688, 1989.
Dale, I. et al. Fundamental Mode Graded Gap Gunn Diode Operation at 77 and 84 GHz. Proc. Microwaves Conf. London 1994, pp. 248–251.

Primary Examiner—Jerome Jackson, Jr.
Assistant Examiner—Bradley W. Baumeister

[57] ABSTRACT

A Gunn diode includes a layered structure including at least a cathode layer, an anode layer, and an active region interposed between the cathode and anode layers, wherein at least a portion of the active region is an AlGaAs layer.

6 Claims, 7 Drawing Sheets

- 51 ~ n⁺GaAs cathode layer
- 52 ~ Graded AlGaAs layer
- 53 ~ AlGaAs layer
- 54 ~ nGaAs active layer
- 55 ~ n⁺GaAs anode layer

50

GUNN DIODE HAVING A GRADED ALUMINUM GALLIUM ARSENIDE ACTIVE LAYER AND GUNN DIODE OSCILLATOR

BACKGROUND OF THE INVENTION

1. Field of the Invention

The present invention relates to a III–V compound semiconductor device, and in part icular, to a Gunn diode. More specifically, the present invention relates to a structure for efficiently operating a Gunn diode in a millimeter wave band.

2. Description of the Related Art

A Gunn diode renders electrons in the conduction band in a hot state (i.e., a state in which the electrons have an energy higher than that in a thermal equilibrium state) by using a high electric field, thereby causing the electrons to transfer from the Γ-valley in the conduction band to the L- or X-valley. The Gunn diode thus generates a compression wave of the electrons, thereby oscillating at a high frequency. Therefore, the Gunn diode is used as a high-frequency oscillator.

FIG. 3 is a schematic cross sectional view of a structure of a conventional general GaAs Gunn diode 30. FIG. 4 is a schematic thermal equilibrium energy band diagram of the structure of FIG. 3, showing an energy level $E_v$ at the upper end of the valence band, and respective energy levels $E_{c\Gamma}$ and $E_{CL}$ at the Γ- and L-valleys of the conduction band. It should be noted that a basically similar structure and energy band structure can be obtained even when InP is used for the Gunn diode in place of GaAs.

The Gunn diode 30 of FIG. 3 has a layered structure including at least a highly doped (e.g., about $5 \times 10^{17}$ cm$^{-3}$) n$^+$GaAs cathode layer 33 (thickness: about 1,000 Å), a relatively lightly doped (e.g., about $2 \times 10^{16}$ cm$^{-3}$) n-type GaAs active layer 34 (thickness: about 10,000 Å), and a highly doped (e.g., about $5 \times 10^{18}$ cm$^{-3}$) n$^+$GaAs anode layer 35. An Au/Ge/Ni cathode ohmic contact layer 31 is formed on the cathode layer 33 with an n$^+$GaAs cap layer 32 (doping level: about $5 \times 10^{18}$ cm$^{-3}$; thickness: about 1,000 Å) interposed therebetween (it should be noted that the cap layer 32 may be omitted). Moreover, an Au/Ge/Ni anode ohmic contact layer 36 is formed under the anode layer 35.

In the structure shown in FIG. 3, when an appropriate bias voltage is applied between the cathode ohmic contact layer 31 and the anode ohmic contact layer 36, a transferred electron effect causes high-energy electrons within the conduction band to transfer from the Γ-valley to the L- or X-valley. This leads to dynamic space-charge variations within the active layer 34, resulting in current oscillations. Due to the low mobility of the electrons which have transferred to the L-valley, the region where such electrons exist serves as a high-resistance layer, thereby forming an electrical dipole layer. This is generally referred to as a "domain". Oscillations occur due to the domain transfer from the cathode layer 33 to the anode layer 35. The oscillation frequency is determined by the transfer distance of the domain, whereas the oscillation efficiency (i.e., an operation efficiency of the Gunn diode) is determined by a dynamic transfer rate of the electrons from the Γ-valley to the L- or X-valley. The presence of the "dead zone" causes reduction in the oscillation efficiency (i.e., the Gunn diode operation frequency) due to its parasitic resistive effect.

In the structure of the conventional Gunn diode 30 shown in FIG. 3, electrons having entered the active layer 34 from the cathode layer 33 have a low average energy, and a region of the active layer 34 in the vicinity of the interface with the cathode layer 33 has a low electric-field intensity. Accordingly, the inter-valley transfer rate is low in the region of the active layer 34 in the vicinity of the interface with the cathode layer 33. Such a region is referred to as a "dead zone", since it does not contribute to an active operation of the Gunn diode 30. Such a dead zone is "parasitic" for the entire structure of the Gunn diode 30, since it disadvantageously affects the operation of the Gunn diode 30, in such a manner as to increase electrical resistance components, reduce or prevent oscillations, and the like.

The oscillation frequency of the Gunn diode 30 is determined by the electron transit-time within the active layer 34, and hence, is directly dependent on the length of the active layer 34. Accordingly, the presence of the dead-zone within the active layer 34 leads to a reduction in the maximum oscillation frequency which can be achieved by the simple conventional structure of the Gunn diode 30, and hence, to a reduction in an operating frequency of the Gunn diode 30. As a result, an operation efficiency (i.e., oscillation efficiency) of the Gunn diode 30 is reduced especially in a high-frequency band.

The presence of the dead zone must be sufficiently considered especially in a Gunn diode which oscillates in a high-frequency band (and hence, must have a short active layer), since such a high-frequency-oscillating Gunn diode has a large relative-ratio of a length of the dead zone to the total length of the active layer.

In order to overcome the above-mentioned problems relating to the dead zone, a "hot-electron injector structure" is sometimes used.

FIG. 5A schematically shows one example of a layered structure of a Gunn diode 50 having such a hot-electron injector structure. FIG. 5B is a schematic thermal equilibrium energy band diagram of the structure of FIG. 5A, showing an energy level $E_v$ at the upper end of the valence band, and an energy level $E_c$ at the lower end of the conduction band.

The Gunn diode 50 has a layered structure including at least a highly doped n$^+$GaAs cathode layer 51, a graded AlGaAs wide-bandgap layer 52 in which an Al mole fraction varies in a graded manner, an AlGaAs wide-bandgap layer 53 having a fixed composition, a relatively lightly doped n-type GaAs active layer 54, and a highly doped n$^+$GaAs anode layer 55. In such a structure, electrons are injected with a high energy from the cathode layer 51 toward the active layer 54 through the AlGaAs wide-bandgap layers 52 and 53 which are interposed between the cathode layer 51 and the active layer 54. As a result, inter-valley transfer occurs more frequently and quickly in the GaAs active layer 54.

In the structure of the Gunn diode 50 shown in FIG. 5A, the AlGaAs wide-bandgap layers 52 and 53 are considered to be a part of the cathode layer 51.

Furthermore, FIG. 6A schematically shows a layered structure of another Gunn diode 60 having a hot-electron injector structure, as disclosed in Japanese Laid-Open Publication No. 58-122791. FIG. 6B is a schematic thermal equilibrium energy band diagram of the structure of FIG. 6A, showing an energy level $E_v$ at the upper end of the valence band, and an energy level $E_c$ at the lower end of the conduction band.

The Gunn diode 60 has a layered structure including at least a highly doped n$^+$GaAs cathode layer 61, an AlGaAs wide-bandgap layer 62 having a fixed composition, a relatively lightly doped n-type GaAs active layer 63, and a highly doped n⁺GaAs anode layer 64. In such a structure, electrons are injected with a high energy from the cathode layer 61 into the active layer 63, while passing through the AlGaAs wide-bandgap layer 62 interposed between the cathode layer 61 and the active layer 63 due to the tunneling effect. As a result, inter-valley transfer occurs more frequently and quickly in the GaAs active layer 63.

In the structure of the Gunn diode 60 shown in FIG. 6A as well, the AlGaAs wide-bandgap layer 62 is considered to be a part of the cathode layer 61.

Each of the conventional Gunn diodes 50 and 60 having the hot-electron injector structure is intended to increase inter-valley transfer of the electrons in a region of the GaAs active layer 54 or 63 in the vicinity of the cathode layer 51 or 61, by increasing an energy of the electrons injected into the GaAs active layer 54 or 63. As described above, each of the AlGaAs wide-bandgap layers 52, 53 and 62 of the respective Gunn diodes 50 and 60 is considered to be a part of the cathode layer 51 or 61, rather than a part of the active layer 54 or 63. In fact, the inter-valley transfer of the electrons does not occur within the AlGaAs wide-bandgap layers 52 and 53 as well as within the AlGaAs wide-bandgap layer 62.

Accordingly, the conventional Gunn diodes 50 and 60 having the respective hot-electron injector structures as shown in FIGS. 5A and 6A do not sufficiently overcome the problem relating to the presence of the dead zone within the active layer, i.e., a limited operation efficiency (oscillation efficiency) at the maximum oscillation frequency as well as in a high-frequency band due to the presence of the dead zone.

SUMMARY OF THE INVENTION

According to one aspect of the invention, a Gunn diode includes a layered structure including at least a cathode layer, an anode layer, and an active region interposed between the cathode and anode layers, wherein at least a portion of the active region is an AlGaAs layer.

In one example, an Al mole fraction x of a composition $Al_xGa_{1-x}As$ of the AlGaAs layer included in the active region decreases with an increasing distance from an interface between the active region and the cathode layer.

In one example, the Al mole fraction x of the composition $Al_xGa_{1-x}As$ of the AlGaAs layer included in the active region varies smoothly and gradually in a direction of current flow.

In one example, the Al mole fraction x of the composition $Al_xGa_{1-x}As$ of the AlGaAs layer included in the active region varies in a step-wise manner in a direction of current flow.

In one example, the active layer includes a two-layer structure of an AlGaAs layer and a GaAs layer.

In one example, an Al mole fraction of a composition $Al_xGa_{1-x}As$ of the AlGaAs layer of the two-layer structure decreases with an increasing distance from an interface between the active region and the cathode layer.

In one example, an Al mole fraction x of a composition $Al_xGa_{1-x}As$ of the AlGaAs layer included in the active region is about 0.3 at an interface between the active region and the cathode layer, the Al mole fraction x is about 0 at a position about 5000 Å away from the interface.

Hereinafter, functions of the present invention will be described.

According to a Gunn diode of the present invention, an active region is at least partially formed from AlGaAs having a smaller inter-valley separation energy. For example, the Gunn diode of the present invention has a GaAs/AlGaAs structure including a two-layer structure of a GaAs layer and an AlGaAs layer, as an active region. In particular, provided that a composition of the AlGaAs layer in the active region is represented as $Al_xGa_{1-x}As$, a graded layer (i.e., a graded AlGaAs active layer) in which an Al mole fraction x is reduced with an increasing distance from a cathode layer (i.e., from the interface between the active region and the cathode layer) is used as the whole $Al_xGa_{1-x}As$ active layer, or at least as a part thereof. This graded AlGaAs layer constitutes a portion of the active region.

According to the Gunn diode of the present invention, the use of such a graded AlGaAs active region allows for a reduction in a dead region within the active region, and an increase in inter-valley transfer of electrons in a region of the active region in the vicinity of the cathode layer. Thus, the Gunn diode having the graded AlGaAs active layer according to the present invention has improved characteristics of the maximum oscillation frequency as well as improved operation efficiency (oscillation frequency) especially in a high-frequency band, as compared to the case where a GaAs layer having a fixed composition is used as the active layer.

In this case, the inter-valley transfer of the electrons is facilitated particularly by setting an Al mole fraction x of a region of the graded AlGaAs active layer in the vicinity of the cathode layer (more specifically, in the vicinity of the interface between the cathode layer and the active region) to about 0.3, thereby contributing especially to a reduction in the dead zone.

Thus, the invention described herein makes possible the advantage of providing a Gunn diode which effectively reduces a dead zone within an active layer, and therefore, has an improved operation efficiency (oscillation efficiency) at the maximum oscillation frequency as well as in the high-frequency band.

This and other advantages of the present invention will become apparent to those skilled in the art upon reading and understanding the following detailed description with reference to the accompanying figures.

DESCRIPTION OF THE PREFERRED EMBODIMENTS

Prior to describing specific examples of the present invention, the result of the study conducted by the inventor to arrive at the present invention will be described. The term "active region" as used herein has the same meaning as that of the term "active layer". The term "active region" may be used particularly in the case where the active layer has a layered structure (i.e., the active layer includes two or more layers).

As previously described, a "dead zone" in the active layer of the Gunn diode is a region of the active layer adjacent to a cathode layer, in which the transferred electron effect, i.e., inter-valley transfer of electrons from the low energy Γ-valley to the high-energy L-valley (or x-valley), does not occur. Therefore, electric field and space-charge oscillations do not propagate through the dead zone.

The degree of inter-valley transfer which occurs in any region of the active layer depends on the energy difference between the respective minimum energy levels of the Γ-valley and the L-valley (or X-valley) and on the energy level of the electrons in that region. Provided that AlGaAs has a composition $Al_xGa_{1-x}As$, the energy difference between Γ-valley and L-valley of the $Al_xGa_{1-x}As$ layer (which is also referred to as "Γ-L inter-valley energy difference") $\Delta E_{\Gamma L}$ is a function of an Al mole fraction x, given by the following expression:

$$\Delta E_{\Gamma L}(eV) = 0.284 - 0.605 \times x,$$

as disclosed in S. Adachi, "GaAs, AlAs, and $Al_xGa_{1-x}As$: Material parameters for use in research and device applications", J. Appl. Phys., 58(3), pp. R1–R29 (1985). Therefore, the inter-valley transfer ratio in the $Al_xGa_{1-x}As$ layer increases with a decreasing Γ-L inter-valley energy difference $\Delta E_{\Gamma L}$ according to an increasing Al mole fraction x.

It is desirable that the Γ-L inter-valley energy difference $\Delta E_{\Gamma L}$ in the active region is small in a region thereof in the vicinity of the cathode layer so as to enable the inter-valley transfer to occur even when the average electron energy is low in this region. On the other hand, however, the Γ-L inter-valley energy difference $\Delta E_{\Gamma L}$ in the active layer is desirably large in a region thereof which is away from the cathode layer (i.e., in a region where an average electron energy is high) so as to enable the Gunn diode to operate at a high voltage level, thereby giving high output power.

It has been found that a structure having such a desired composition (Γ-L inter-valley energy difference $\Delta E_{\Gamma L}$) as described above can be obtained by using the $Al_xGa_{1-x}As$ layer as the active layer (or, as at least a portion of the active layer) and varying the Al mole fraction x according to the distance from the interface with the cathode layer.

Figure 1:
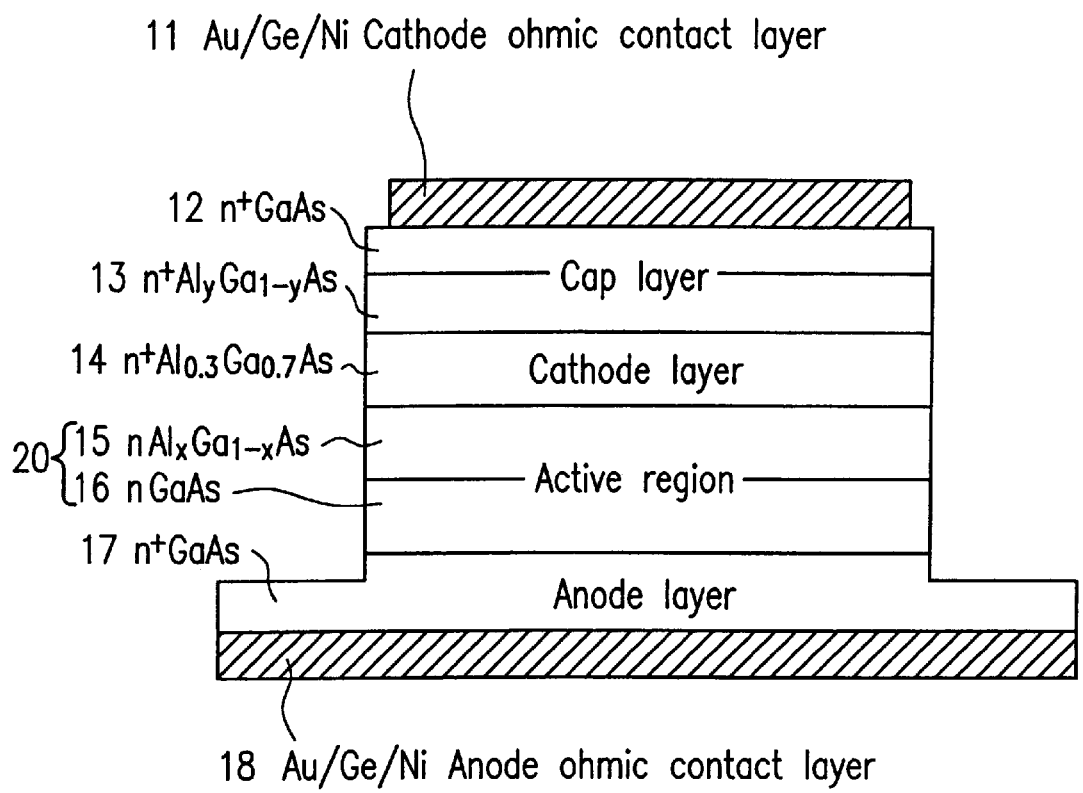
FIG. 1 is a schematic cross sectional view of a structure of a Gunn diode according to an example of the present invention.
Figure 2:
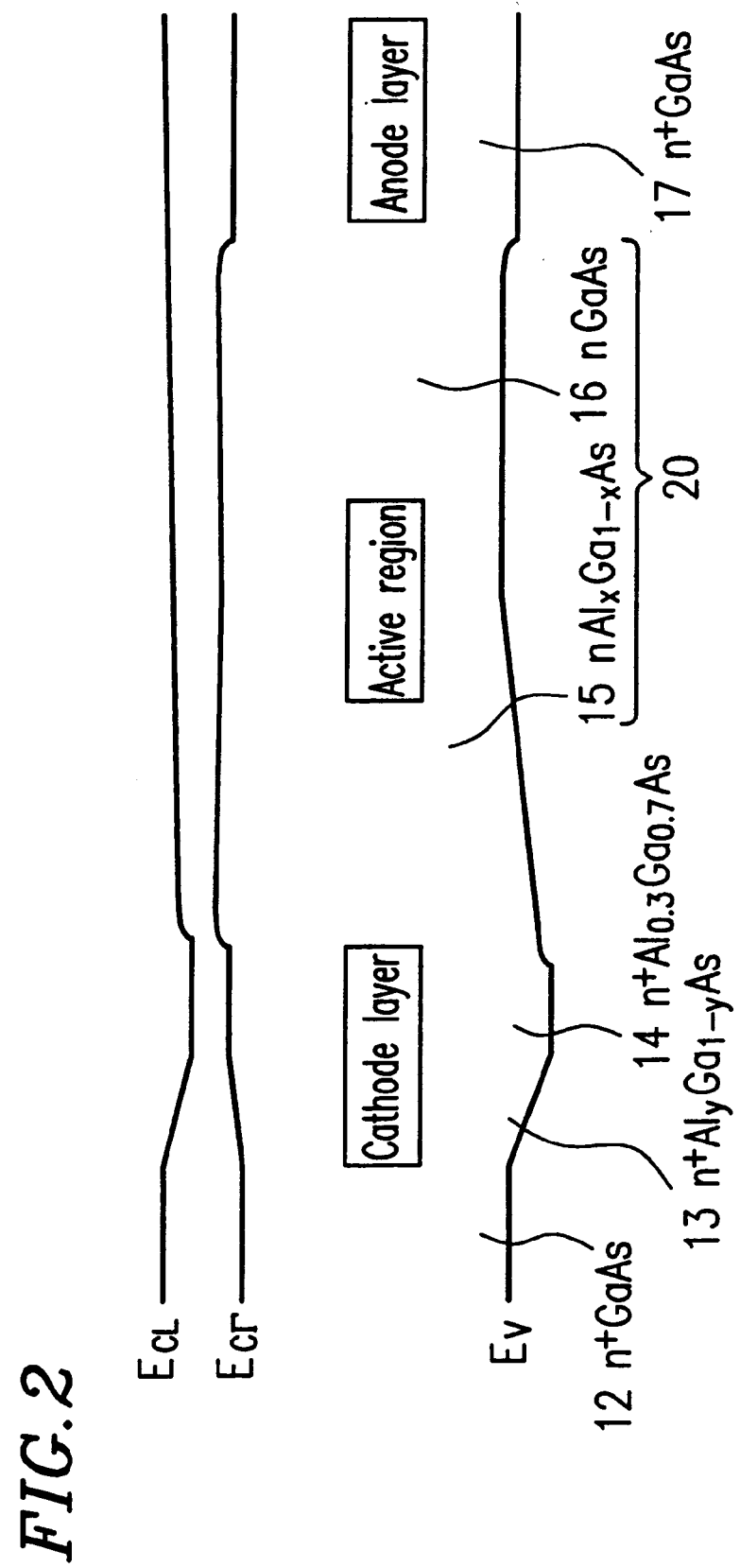
FIG. 2 is a schematic thermal equilibrium energy band diagram of the structure of FIG. 1, showing an energy level $E_v$ at the upper end of the valence band, and respective energy levels $E_{c\Gamma}$ and $E_{cL}$ at the Γ- and L-valleys of the conduction band.
Figure 3:
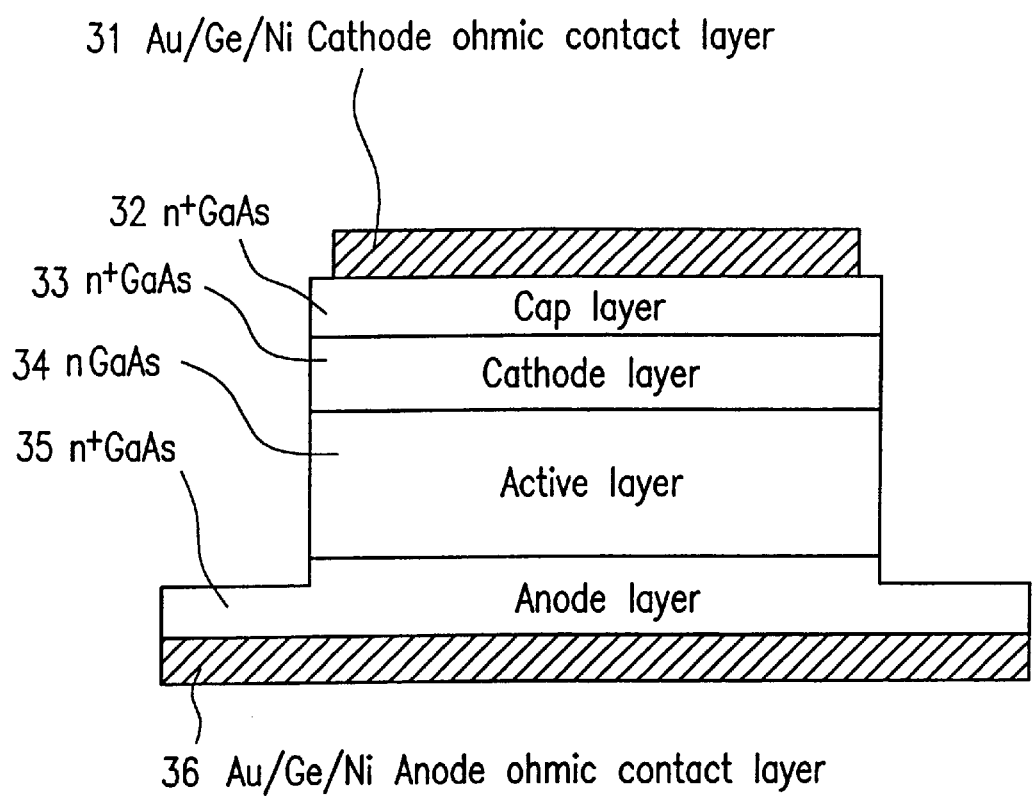
FIG. 3 is a schematic cross sectional view of a structure of a conventional general GaAs Gunn diode.
Figure 4:
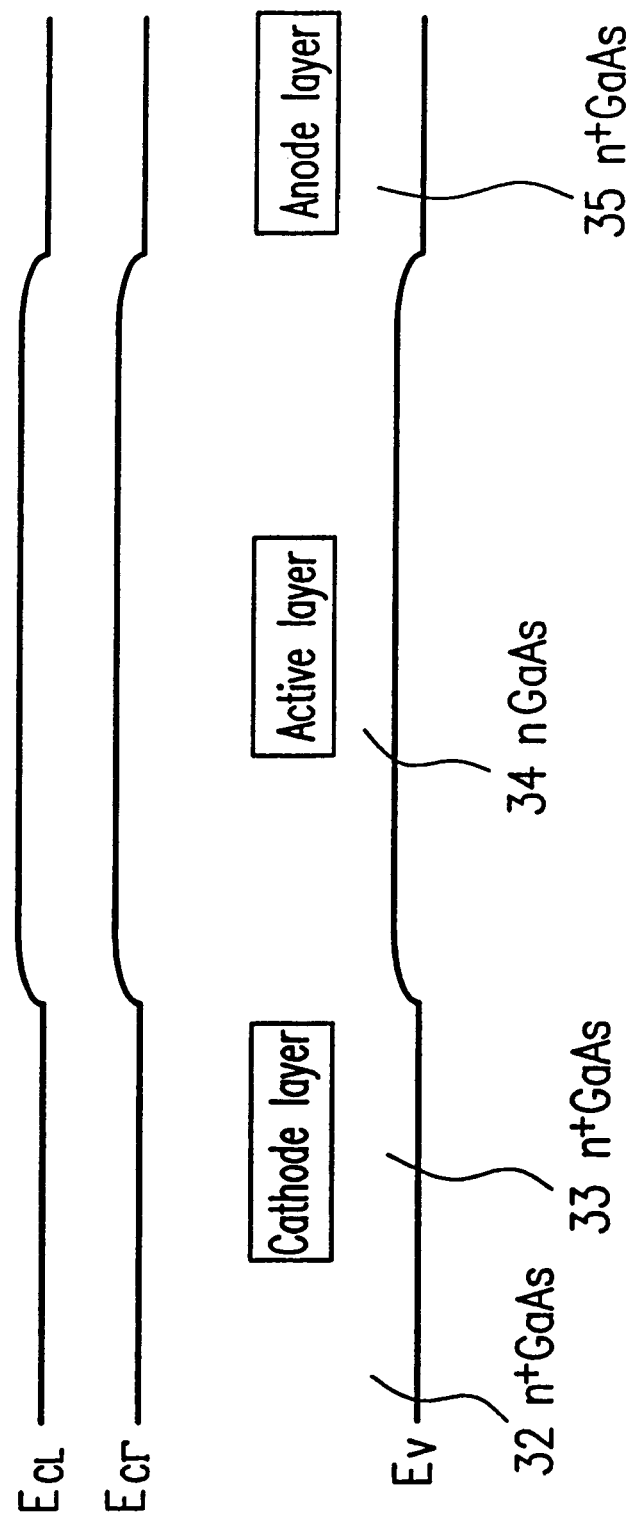
FIG. 4 is a schematic thermal equilibrium energy band diagram of the structure of FIG. 3, showing an energy level $E_v$ at the upper end of the valence band, and respective energy levels $E_{c\Gamma}$ and $E_{cL}$ at the Γ- and L-valleys of the conduction band.
Figures 5A, 5B:
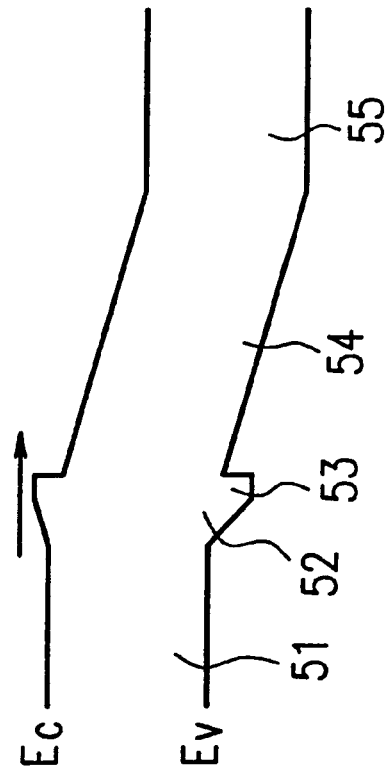
FIG. 5A is a schematic diagram of a layered structure of a conventional Gunn diode having a hot-electron injector structure.
FIG. 5B is a schematic thermal equilibrium energy band diagram of the structure of FIG. 5A, showing an energy level $E_v$ at the upper end of the valence band, and an energy level $E_c$ at the lower end of the conduction band.
Figure 6B:
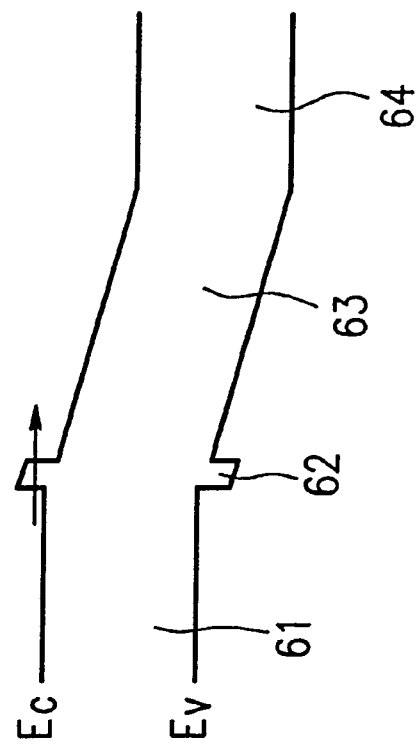
FIG. 6B is a schematic thermal equilibrium energy band diagram of the structure of FIG. 6A, showing an energy level $E_v$ at the upper end of the valence band, and an energy level $E_c$ at the lower end of the conduction band.
Figure 6A:
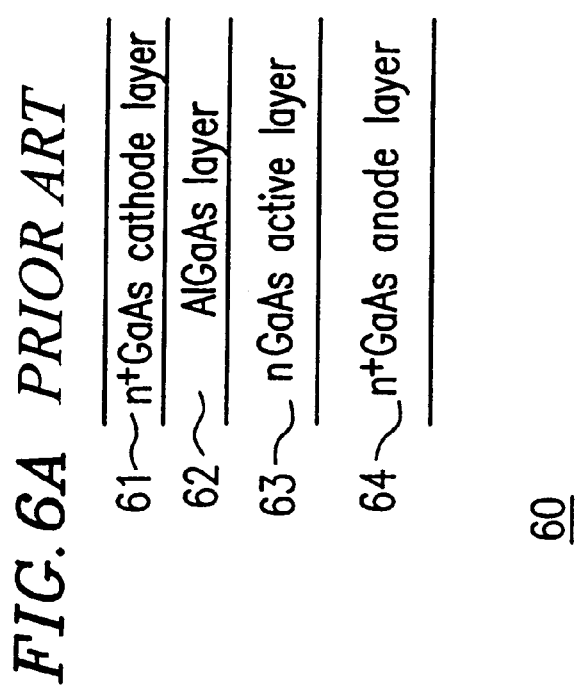
FIG. 6A is a schematic diagram of a layered structure of another conventional Gunn diode having a hot-electron injector structure.

FIG. 1 is a schematic cross sectional view of a structure of a Gunn diode 100 according to an example of the present invention. FIG. 2 is a schematic thermal equilibrium energy band diagram of the structure of FIG. 1, showing an energy level $E_v$ at the upper end of the valence band as well as respective energy levels $E_{c\Gamma}$ and $E_{CL}$ at the Γ- and L-valleys of the conduction band.

The Gunn diode 100 of FIG. 1 has a layered structure including at least a highly doped (e.g., about $5 \times 10^{18}$ cm$^{-3}$) n$^+$GaAs cap layer 12 (thickness: about 1,000 Å), a highly doped n$^+$Al$_y$Ga$_{1-y}$As graded cap layer 13 (thickness: about 500 Å; doping level: about $5 \times 10^{17}$ cm$^{-3}$) in which an Al mole fraction y varies gradually, a highly doped n$^+$Al$_{0.3}$Ga$_{0.7}$As cathode layer 14 (thickness: about 1,000 Å; doping level: about $5 \times 10^{17}$ cm$^{-3}$), a relatively lightly doped (e.g., about $2 \times 10^{16}$ cm$^{-3}$) n-type Al$_x$Ga$_{1-x}$As graded active layer 15 (thickness: about 5,000 Å) in which an Al mole fraction x varies gradually, a relatively lightly doped (e.g., about $2 \times 10^{16}$ cm$^{-3}$) n-type GaAs active layer 16 having a fixed composition, and a highly doped (e.g., about $5 \times 10^{18}$ cm$^{-3}$) n$^+$GaAs anode layer 17. The n-type GaAs active layer 16 and the n-type Al$_x$Ga$_{1-x}$As graded active layer 15 form an active region 20.

Moreover, an Au/Ge/Ni cathode ohmic contact layer 11 is formed on the cap layer 12, and an Au/Ge/Ni anode ohmic contact layer 18 is formed under the anode layer 17.

The Al mole fraction y of the n$^+$Al$_y$Ga$_{1-y}$As graded cap layer 13 is y=to about 0 at the interface with the n$^+$GaAs cap layer 12, where the graded cap layer 13 substantially is a GaAs layer. The Al mole fraction y of the graded cap layer 13 gradually increases toward the cathode layer 14, reaching y=to about 0.3 at the interface with the n$^+$Al$_{0.3}$Ga$_{0.7}$As cathode layer 14. On the other hand, the Al mole fraction x of the n$^+$Al$_x$Ga$_{1-x}$graded active layer 15 is x=to about 0.3 at the interface with the n$^+$Al$_{0.3}$Ga$_{0.7}$As cathode layer 14. The Al mole fraction x of the graded active layer 15 gradually decreases toward the n-type GaAs active layer 16, reaching x=to about 0 at the interface with the n-type GaAs active layer 16, where the graded layer 15 substantially is a GaAs layer.

By using a Monte Carlo method, a series of simulations were conducted using a Gunn diode structure similar to that shown in FIG. 1. FIGS. 7A to 7D show the simulation results.

Figure 7A:
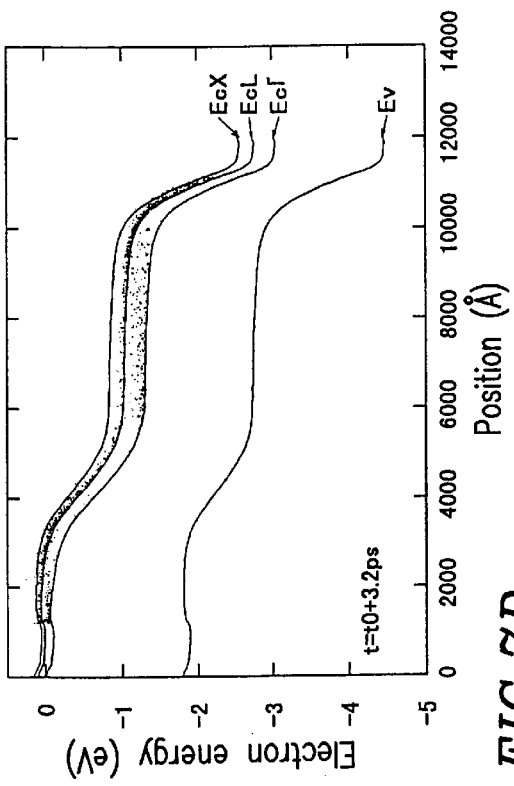
FIGS. 7A to 7D show the results of simulations for a Gunn diode structure of the present invention, showing a change in an instantaneous energy band structure (an energy level $E_v$ at the upper end of the valence band as well as respective energy levels $E_{c\Gamma}$, $E_{CL}$ and $E_{CX}$ at the Γ-, L- and X-valleys in the conduction band) in a space from a cathode layer through an active region to an anode layer at progressive instants during an oscillating operation period.
Figure 7B:
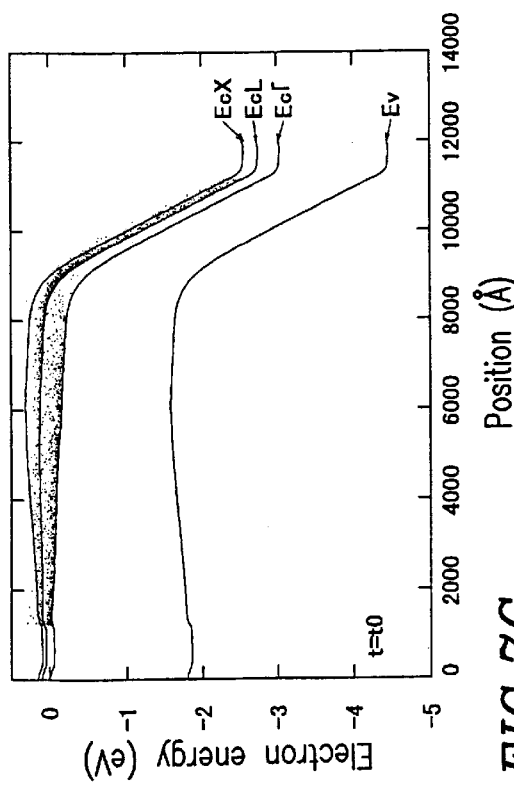
Figure 7C:
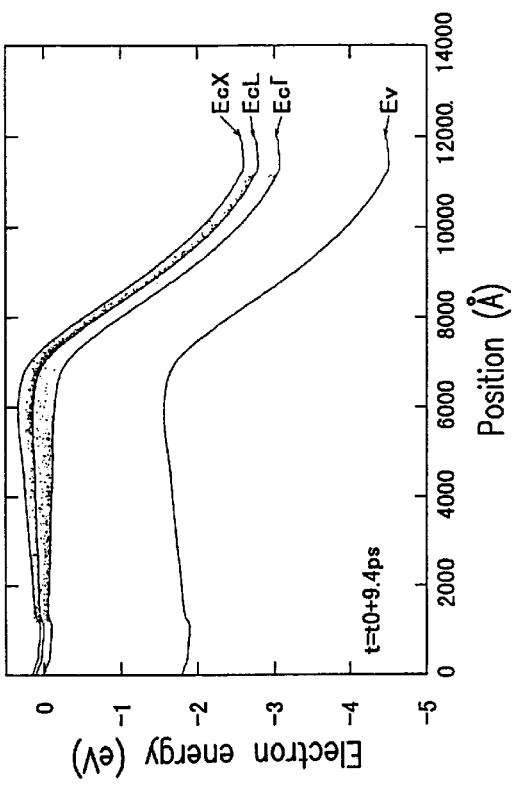
Figure 7D:
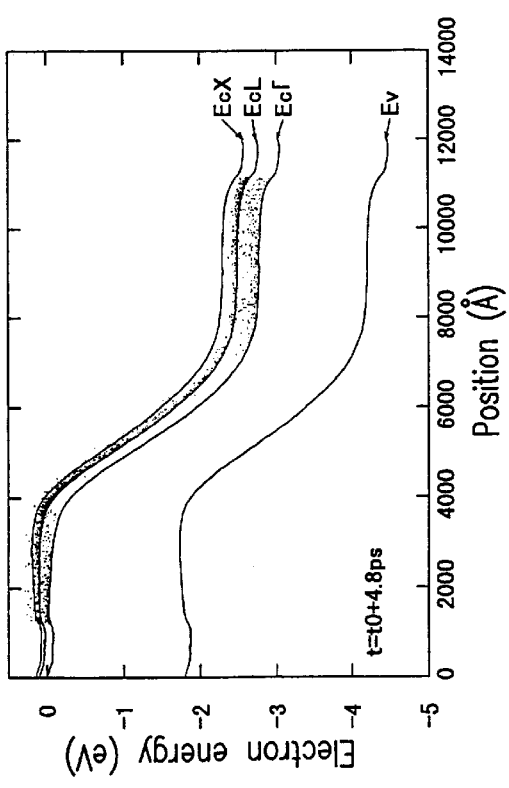

More specifically, with respect to a Gunn diode structure similar to that of FIG. 1, i.e., a Gunn diode structure including an Al$_{0.3}$Ga$_{0.7}$As cathode layer with a doping level of about $5 \times 10^{17}$ cm$^{-3}$, an Al$_x$Ga$_{1-x}$As/GaAs active region with a doping level of about $2 \times 10^{16}$ cm$^{-3}$ (thickness: about 0.5 μm/about 0.5 μm) and a GaAs anode layer with a doping level of about $5 \times 10^{17}$ cm$^{-3}$, simulations were performed to calculate an instantaneous energy band structure (an energy level $E_v$ at the upper end of the valence band as well as respective energy levels $E_{c\Gamma}$, $E_{CL}$ and $E_{CX}$ of the Γ-, L- and X-valleys in the conduction band) in a space from the cathode layer through the active region to the anode layer at progressive instants (t=t0, 0+3.2 picoseconds (ps), t0+4.8 ps, and t0+9.4 ps) during an oscillating operation period. It should be noted that FIG. 7A shows the simulation result at t=t0, and FIG. 7B shows the simulation results 3.2 picoseconds after the simulation result of FIG. 7A (i.e., at t=t0+3.2 ps). FIGS. 7C and 7D show the simulation results at t=t0+4.8 Ps and t=t0+9.4 Ps, respectively. In each of FIGS. 7A to 7D, the ordinate indicates an electron energy level (eV), and the abscissa indicates a lateral position (unit: Å).

Moreover, electrons are treated as particles in these simulations, and electrons in the active region are shown as "dots" in FIGS. 7A to 7D.

The cap layer, cathode ohmic contact layer and anode ohmic contact layer included in the structure of FIG. 1 are not considered in the simulations, since they do not affect a fundamental operation of the Gunn diode.

It can be seen from FIGS. 7A to 7D that electric field and space-charge oscillations propagate through substantially the entire active region. In other words, it has been confirmed that, in the Gunn diode structure of the present invention, there is no dead zone within the active region even though the total thickness of the active region (i.e., the total thickness of the $Al_xGa_{1-x}As$ layer and the GaAs layer) is as small as only about 1.0 $\mu$m.

From the simulations, it was found that by providing the $Al_xGa_{1-x}As$ graded layer, in which a composition (Al mole fraction x) gradually varies, as at least a portion of the active region of the Gunn diode, a dead zone within the active region can be effectively reduced. In such a graded active layer, the composition (Al mole fraction x) may be varied from the interface with the cathode layer into the active layer, according to a change in the distance from the interface. In other words, the composition (Al mole fraction x) of the graded active layer may be varied in the electron travel direction (i.e., in the direction of current flow) between the anode and cathode layers.

Such an effect can be obtained when the composition (Al mole fraction x) of the $Al_xGa_{1-x}As$ graded active layer is varied either in a smooth or stepwise manner. In order to obtain a more preferable effect, it is preferable that the active layer has a two-layer structure including a GaAs active layer adjacent to the anode layer and an $Al_xGa_{1-x}As$ graded active layer adjacent to the cathode layer.

The best results were obtained from an active layer (active region) 20 which has a two-layer structure including a GaAs active layer 16 adjacent to an anode layer 17 and an $Al_xGa_{1-x}As$ graded active layer 15 (thickness: about 5,000 Å) adjacent toacathode layer 14. In this structure, the Al mole fraction x of the $Al_xGa_{1-x}As$ graded active layer 15 is x=about 0.3 at the interface with the $Al_{0.3}Ga_{0.7}As$ cathode layer 14, and gradually decreases toward the n-type GaAs active layer 16. The Al mole fraction x of the $Al_xGa_{1-x}As$ graded active layer 15 is x=about 0 at the interface with the n-type GaAs active layer 16 (i.e., at the position about 5,000 Å away from the interface with the cathode layer 14), where the graded active layer 15 substantially is a GaAs layer.

As has been described above, according to the present invention, the use of a graded AlGaAs active region allows for a reduction in a dead region within an active layer (active region), and an increase in inter-valley transfer of electrons in a region of the active region in the vicinity of a cathode layer. Thus, a Gunn diode having the graded AlGaAs active layer according to the present invention has improved characteristics of the maximum oscillation frequency as well as improved operation efficiency (oscillation frequency) especially in a high-frequency band, as compared to the case where a GaAs layer having a fixed composition is used as the active layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A Gunn diode comprising:

a multiple-layer structure, said multiple-layer structure including a cathode layer, anode layer, and an active region sandwiched between said cathode layer and anode layer, wherein at least one portion of said active region is an AlGaAs layer having a composition of $Al_xGa_{1-x}As$, and wherein a ratio of Al in said composition of $Al_xGa_{1-x}As$ is based on the direction of flowing current.

2. The Gunn diode according to claim 1, wherein said ratio gradually changes based on the direction of flowing current.

3. The Gunn diode according to claim 1, wherein said ratio changes step-wise based on the direction of flowing current.

4. The Gunn diode according to claims 1 or claim 3, wherein said active region further includes GaAs layer in addition to said AlGaAs layer, and wherein said GaAs layer is provided in a direction of electrons running from said AlGaAs layer.

5. The Gunn diode according to any one of claims 3 to 4, wherein the ratio of Al component is X=0.3 at a boundary plane disposed between said active region and cathode layer, and wherein the ratio is X=0 at a position away from said boundary plane at a distance of about 5000 Å.

6. An oscillation circuit including the Gunn diode according to any one of claims 1 to 3, wherein said anode layer of GaAs is loaded with a positive bias against said cathode layer of AlGaAs in the Gunn diode.

* * * * *